United States Patent
Zong

(10) Patent No.: US 12,351,911 B2
(45) Date of Patent: Jul. 8, 2025

(54) HYDROPHOBIC LOW-DIELECTRIC-CONSTANT FILM AND PREPARATION METHOD THEREFOR

(71) Applicant: JIANGSU FAVORED NANOTECHNOLOGY CO., LTD., Jiangsu (CN)

(72) Inventor: Jian Zong, Jiangsu (CN)

(73) Assignee: Jiangsu Favored Nanotechnology Co., Ltd., Jiangsu (CN)

( * ) Notice: Subject to any disclaimer, the term of this patent is extended or adjusted under 35 U.S.C. 154(b) by 0 days.

(21) Appl. No.: 17/595,435

(22) PCT Filed: May 14, 2020

(86) PCT No.: PCT/CN2020/090120
§ 371 (c)(1),
(2) Date: Nov. 16, 2021

(87) PCT Pub. No.: WO2020/233481
PCT Pub. Date: Nov. 26, 2020

(65) Prior Publication Data
US 2022/0145460 A1    May 12, 2022

(30) Foreign Application Priority Data

May 17, 2019   (CN) .......................... 201910410096.1

(51) Int. Cl.
*C23C 16/455*  (2006.01)
*C23C 16/02*   (2006.01)
(Continued)

(52) U.S. Cl.
CPC .... *C23C 16/45536* (2013.01); *C23C 16/0227* (2013.01); *C23C 16/45534* (2013.01);
(Continued)

(58) Field of Classification Search
CPC .......... C23C 16/45536; C23C 16/0227; C23C 16/45534; C23C 16/50; C23C 16/30;
(Continued)

(56) References Cited

U.S. PATENT DOCUMENTS 5,302,420 A   4/1994  Nguyen et al.
6,149,987 A   11/2000 Perng et al.
(Continued)

FOREIGN PATENT DOCUMENTS

CN    1367205 A    9/2002
CN    1389591 A    1/2003
(Continued)

OTHER PUBLICATIONS

Watanabe, "Source Gas Dependency of Amorphous Fluorinated Carbon Film Properties Prepared by Plasma Enhanced Chemical Vapor Deposition Using C4F8, C4F6, and C5F8 Gases", 2006 Jpn. J. Appl. Phys. 45 L463-L466 (Year: 2006).*

(Continued)

*Primary Examiner* — Andrew J. Oyer
(74) *Attorney, Agent, or Firm* — Greenberg Traurig, LLP; Chinh H. Pham; Joshua I. Rudawitz

(57) ABSTRACT

The present disclosure provides a hydrophobic low-dielectric-constant film and a preparation method therefor. The low-dielectric-constant film is formed from one or more fluorine-containing compounds A by means of a plasma enhanced chemical vapor deposition method, and the one or more fluorine-containing compounds comprise a compound having the general formula $C_xSi_yO_mH_nF_{2x+2y-n+2}$ or $C_xSi_yO_mH_nF_{2x+2y-n}$, x being an integer from 1 to 20, y being an integer from 0 to 8, m being an integer from 0 to 6, and n being 0, 3, 6, 7, 9, 10, 12, 13, 15, 16, 17 and 19. Thus, a nano-film having a low dielectric constant and good hydrophobicity is formed on the surface of a substrate.

28 Claims, 1 Drawing Sheet

(51) Int. Cl.
*C23C 16/50* (2006.01)
*H05K 1/02* (2006.01)
*H05K 3/00* (2006.01)
*H05K 3/14* (2006.01)

(52) U.S. Cl.
CPC ............. *C23C 16/50* (2013.01); *H05K 1/028* (2013.01); *H05K 3/0091* (2013.01); *H05K 3/146* (2013.01); *H05K 2201/0137* (2013.01); *H05K 2203/0392* (2013.01)

(58) Field of Classification Search
CPC ..... C23C 16/455; C23C 16/458; C23C 16/44; H05K 1/028; H05K 3/0091; H05K 3/146; H05K 2201/0137; H05K 2203/0392; H05K 3/28; B05D 3/0486; B05D 3/0493; B05D 5/12; B05D 2401/33; B05D 2506/10; B05D 2518/10; B05D 1/60; B05D 1/62; B05D 5/083; C08F 214/265; C09D 127/18; H01L 21/02131; H01L 21/02203; H01L 21/02216; H01L 21/02274; H01L 23/5329; H01L 21/4846; B82Y 30/00

See application file for complete search history.

(56) References Cited

U.S. PATENT DOCUMENTS

| | | | |
|---|---|---|---|
| 6,852,651 | B2 | 2/2005 | Shioya et al. |
| 8,216,861 | B1 | 7/2012 | Yim et al. |
| 9,558,934 | B2 | 1/2017 | Canaperi et al. |
| 11,185,883 | B2* | 11/2021 | Zong ........................ B05D 1/62 |
| 2002/0045359 | A1 | 4/2002 | Todd |
| 2002/0113316 | A1 | 8/2002 | Shioya et al. |
| 2003/0049460 | A1 | 3/2003 | O'Neill et al. |
| 2004/0137757 | A1 | 7/2004 | Li et al. |
| 2004/0166240 | A1 | 8/2004 | Rhee et al. |
| 2004/0197474 | A1 | 10/2004 | Vritis et al. |
| 2004/0265505 | A1* | 12/2004 | Winther-Jensen .... C04B 41/009 427/535 |
| 2005/0003213 | A1 | 1/2005 | Ohdaira et al. |
| 2005/0156285 | A1 | 7/2005 | Gates et al. |
| 2005/0181628 | A1 | 8/2005 | Nobutoki et al. |
| 2005/0245096 | A1 | 11/2005 | Gates et al. |
| 2006/0172531 | A1 | 8/2006 | Lin et al. |
| 2007/0172666 | A1* | 7/2007 | Denes ...................... B05D 1/62 428/421 |
| 2011/0206857 | A1 | 8/2011 | Yim et al. |
| 2013/0171546 | A1 | 7/2013 | White et al. |
| 2013/0330482 | A1 | 12/2013 | Leu et al. |
| 2016/0068960 | A1 | 3/2016 | Jung et al. |
| 2017/0245374 | A1 | 8/2017 | Williams-Duncan |
| 2020/0283904 | A1* | 9/2020 | Zong ................... C23C 16/4584 |

FOREIGN PATENT DOCUMENTS

| | | | | |
|---|---|---|---|---|
| CN | 1522462 | A | 8/2004 | |
| CN | 1645608 | A | 7/2005 | |
| CN | 1662676 | A | 8/2005 | |
| CN | 1698189 | A | 11/2005 | |
| CN | 1255573 | C | 5/2006 | |
| CN | 1815709 | A1 | 8/2006 | |
| CN | 1950932 | A | 4/2007 | |
| CN | 101065834 | A | 10/2007 | |
| CN | 101393865 | A | 3/2009 | |
| CN | 102317752 | A | 1/2012 | |
| CN | 102770580 | A | 11/2012 | |
| CN | 102822949 | A | 12/2012 | |
| CN | 103608898 | A | 2/2014 | |
| CN | 104968733 | A | 10/2015 | |
| CN | 105280816 | A | 1/2016 | |
| CN | 106291911 | A | 1/2017 | |
| CN | 106496529 | A | 3/2017 | |
| CN | 106958012 | A | 7/2017 | |
| CN | 109277269 | | 1/2019 | |
| CN | 110129769 | A | 8/2019 | |
| CN | 110158052 | A | 8/2019 | |
| EP | 1150345 | A2 | 10/2001 | |
| EP | 1225194 | A2 | 7/2002 | |
| EP | 1617957 | | 1/2006 | |
| EP | 1225194 | B1 * | 10/2008 | ............... B05D 1/60 |
| EP | 3628756 | A1 | 4/2020 | |
| EP | 3674438 | A1 | 7/2020 | |
| GB | 2405404 | A | 3/2005 | |
| JP | H04345030 | A | 12/1992 | |
| JP | 2002252228 | A | 9/2002 | |
| JP | 106302704 | A | 8/2003 | |
| JP | 2004-264420 | * | 9/2004 | ............... G02B 5/20 |
| JP | 2016521296 | A | 7/2016 | |
| TW | I238471 | B | 8/2005 | |
| WO | 2003095702 | A | 11/2003 | |
| WO | 2004083495 | A2 | 9/2004 | |
| WO | 2005004221 | A2 | 1/2005 | |
| WO | 2004083495 | A3 | 2/2005 | |
| WO | 2007061134 | A1 | 5/2007 | |
| WO | 2010096172 | A1 | 8/2010 | |
| WO | 2019037446 | A1 | 2/2019 | |
| WO | WO-2019108680 | A1 * | 6/2019 | |

OTHER PUBLICATIONS

International Search Report in PCT International Application No. PCT/CN2020/090120 mailed Aug. 12, 2020.

European Extended Search Report; 20810537.9; Date: May 10, 2023; Examiner Boussard, Nadege.

* cited by examiner

HYDROPHOBIC LOW-DIELECTRIC-CONSTANT FILM AND PREPARATION METHOD THEREFOR

CROSS REFERENCE TO RELATED APPLICATIONS

This application is the national phase of International Application No. PCT/CN2020/090120, filed on 14 May 2020, which claims the benefit of priority to Chinese Patent Application No. 201910410096.1, filed on 17 May 2019, the entire disclosure of which is incorporated herein by reference.

TECHNICAL FIELD

The present disclosure relates to the field of manufacture of very large scale integrated circuits, in particular to a hydrophobic low-dielectric-constant film and a preparation method therefor.

BACKGROUND

In recent years, with the rapid development of electronic information technology, electronic products advance towards the direction of light and thin appearance, faster speed, more diversified functions, and higher intelligence degree. With the geometric improvement of network speed, the demand for information processing capacity of electronic products is more obvious. With such development trend, the size of an integrated circuit is continuously reduced, the number of devices integrated on a chip is increased. Accordingly, the requirement on the integration level is higher and higher.

As the integration level of large-scale integrated circuits becomes higher and higher, the feature size of the device decreases gradually, leading to the increase of wire resistance and interwire and interlayer capacitance, which causes increase of resistance-capacitance (RC), thereby resulting in a series of problems such as signal transmission delay, intense noise interference and power loss increase, etc., which greatly limits the high-speed performance of the device. One of the important methods for alleviating these problems is to reduce the dielectric constant (k) of the dielectric material.

In the field of radio communication technology, especially in the communication technology of GHz range, low loss materials with low dielectric constants have attracted more and more attention of people.

The Clausius-Mossotti equation provides two directions for reducing the dielectric constant of the material: one is to reduce the polarity of the material itself, including electron polarization, ion polarization, molecular dipolarization, and space charge polarization; the other is to reduce the molecular density of the material. The latter method is mainly by introducing nano, micro size pores into the materials to generate porous materials, but this method often leads to a significant decline in the thermal conductivity and mechanical properties of the materials. More seriously, due to the capillary effect, the porous materials are liable to absorb water, so they could not be applied to the dielectric layer of electronic components.

Some studies indicate, fluorocarbon materials have excellent heat resistance, chemical resistance and weather resistance. The bond energy (440 kJ/mol) of C—F bond is higher than that of C—H, C—O and C—C. The C—F bond has a lower polarizability than the C—H bond due primarily to the small radius of F atoms and negative charge concentration, so that it could tightly confine the electron cloud in a small area centered on the atomic nucleus. Introducing F atoms can also increase the free volume of the material. When the units constituting the fluorocarbon material have a symmetrical structure, the polarities of C—F bonds distributed on two sides of the C—C main chain are mutually counteracted, such that the whole molecule is in a non-polar state, and the dielectric constant of the material could be further reduced. However, this kind of material often has the disadvantage of difficult processing, for example, the dielectric constant of polytetrafluoroethylene could be reduced to about 2.1, and the polytetrafluoroethylene has good water absorption and chemical stability, but the polytetrafluoroethylene is difficult to process and difficult to mold for the second time, so that the application of the polytetrafluoroethylene in electronic products is limited.

In addition, in some existing studies, plasma enhanced chemical vapor deposition (PECVD) technology is used to prepare nanometer films with low dielectric constants. For example, one or more organosilicon compounds are introduced into a plasma enhanced chemical vapor deposition chamber, and a pore-forming agent is introduced into the chamber, under constant radio frequency power conditions the one or more organosilicon compounds are reacted with the pore-forming agent, to deposit a low-k film on a substrate in the chamber. Further, the low-k film is subjected to high-temperature annealing post-treatment, to substantially remove the pore-forming agent from the low-k film. However, in this manner, firstly it requires that the pore-forming agent is introduced to form pores to reduce the dielectric constant, the pores being detrimental to the hydrophobicity of the material, secondly it requires high temperature annealing to remove the pore-forming agent, which is detrimental to the use of the low dielectric constant film in electronic products.

Additionally, in some studies, polyarylene sulfide and copolymer of tetrafluoroethylene and perfluoroethylenically unsaturated compound are used as raw material, after mixing and kneading, a resin composite insulating layer comprising fluororesin and having p-dielectric constant of 3.0-4.0 is extruded out. The low dielectric constant insulating layer prepared by this method is above micron level, which is not suitable for large-scale integrated circuit.

The statements herein provide only background information relating to the present disclosure and do not necessarily constitute prior art.

SUMMARY

One advantage of the present disclosure is to provide a hydrophobic low-dielectric-constant film and a preparation method therefor, which adopt a plasma enhanced chemical vapor deposition (PECVD) method, use a material comprising low polarizability as reactant, to form a non-porous structure nano-film, which has a low dielectric constant, and a good hydrophobicity.

One advantage of the present disclosure is to provide a hydrophobic low-dielectric-constant film and a preparation method therefor. The hydrophobic low-dielectric-constant film has a fluoropolymer or fluorosilicone polymer with low surface energy, has good hydrophobic property, has a large static contact angle when water is on a surface thereof, and is suitable for being applied to electronic devices.

One advantage of the present disclosure is to provide a hydrophobic low-dielectric-constant film and a preparation method therefor, the unit constituting the fluorocarbon material having an asymmetric structure, being easy to process, and being easy to secondarily mold.

One advantage of the present disclosure is to provide a hydrophobic low-dielectric-constant film and a preparation method therefor, which adopt a PECVD process to form a nano-scale thin film, with a small thickness, being suitable for application in large-scale integrated circuit.

One advantage of the present disclosure is to provide a hydrophobic low-dielectric-constant film and a preparation method therefor, which do not need high-temperature annealing treatment, does not affect the electronic product, and is suitable for application to electronic products and large-scale integrated circuit.

One advantage of the present disclosure is to provide a hydrophobic low-dielectric-constant film and a preparation method therefor, which use a PECVD method to prepare a nano-film, which are good in performance controllability. By finely adjusting and controlling the adding amount of reactants, the proportion of the reactants and process parameters in the vapor deposition process are able to obtain nano-films with different performances.

One advantage of the present disclosure is to provide a hydrophobic low-dielectric-constant film and a preparation method therefor, which, by selecting reactants, are able to regulate and control the mechanical property, water resistance, and corrosion resistance of the low-dielectric-constant film.

One advantage of the present disclosure is to provide a hydrophobic low-dielectric-constant film and a preparation method therefor, which adopt a dynamic coating method, more uniformly attach the low-dielectric-constant film to a substrate, and reduce the difference of coating films at different positions of the substrate, which solves the problem of non-uniform thickness caused by different concentrations of deposits in different regions of the substrate.

One advantage of the present disclosure is to provide a hydrophobic low-dielectric-constant film and a preparation method therefor, which by adding a cross-linking agent with multiple functional groups, directly cross-links raw materials of the low-dielectric-constant film in the polymerization deposition process. The compactness of the hydrophobic low-dielectric-constant film is high, the mechanical property of the hydrophobic low-dielectric-constant film is relatively good, and the thermal annealing treatment procedure and the cost generated by the thermal annealing treatment procedure in the large-scale production process are saved.

One advantage of the present disclosure is to provide a hydrophobic low-dielectric-constant film and a preparation method therefor, which utilize plasma to excite chemical reaction, and could avoid the drawback that a high specific condition is needed between raw materials to activate in conventional chemical reactions.

In order to achieve at least one of the above advantages of the present disclosure, one aspect of the present disclosure provides a hydrophobic low-dielectric-constant film, which is formed from one or more fluorine-containing compounds A by a plasma enhanced chemical vapor deposition method, wherein the one or more fluorine-containing compounds comprise a compound having a general formula $C_xSi_yO_mH_nF_{2x+2y-n+2}$ or $C_xSi_yO_mH_nF_{2x+2y-n}$, wherein x is an integer from 1 to 20, y is an integer from 0 to 8, m is an integer from 0 to 6, and n is 0, 3, 6, 7, 9, 10, 12, 13, 15, 16, 17, 19.

According to one embodiment, a hydrophobic low-dielectric-constant film is formed of the compound A and a crosslinker compound B by vapor deposition reaction.

According to one embodiment, a hydrophobic low-dielectric-constant film is formed of the compound A and a compound C having a large steric hindrance volume by vapor deposition reaction.

According to one embodiment, a hydrophobic low-dielectric-constant film is formed of the compound A, a crosslinker compound B, and a compound C having a large steric hindrance volume by vapor deposition reaction.

According to one embodiment of the hydrophobic low-dielectric-constant film, x is an integer from 1 to 10, y is an integer from 0 to 6, and m is an integer from 0 to 3.

According to one embodiment of the hydrophobic low-dielectric-constant film, a molar ratio of the compound A is greater than 35%.

According to one embodiment of the hydrophobic low-dielectric-constant film, the compound A is one or more selected from a group consisting of: tetrafluoroethylene, hexafluoropropylene, hexafluoroethane, hexafluoropropylene oxide, 1H,1H,2H,2H-perfluorooctyltriethoxysilane, trimethylfluorosilane, and octafluorobutene.

According to one embodiment of the hydrophobic low-dielectric-constant film, the compound B is one or more selected from a group consisting of: butadiene, perfluorobutadiene, pentadiene, 1, 2-epoxy-5-hexene, hexadiene, and heptadiene.

According to one embodiment of the hydrophobic low-dielectric-constant film, the compound C is one or more selected from a group consisting of cyclohexane, toluene, xylene, vinylbenzene, divinylbenzene, dicyclopentadiene, naphthalene, and pyridine.

According to one embodiment of the hydrophobic low-dielectric-constant film, the compound B comprises a bifunctional or polyfunctional group molecule comprising an unsaturated carbon-carbon double bond.

According to one embodiment of the hydrophobic low-dielectric-constant film, the compound C is selected from a group consisting of: cycloalkanes, aromatics, fused ring aromatics, and aromatic heterocycles.

According to one embodiment of the hydrophobic low-dielectric-constant film, the k value range of the hydrophobic low-dielectric-constant film is selected from: 1.8 to 1.9, 1.9 to 2.0, 2.0 to 2.1, 2.1 to 2.2, 2.2 to 2.3, 2.3 to 2.4, 2.4 to 2.5, 2.5 to 2.6, 2.6 to 2.7, or 2.7 to 2.8.

According to one embodiment of the hydrophobic low-dielectric-constant film, the hydrophobic low-dielectric-constant film has a static contact angle selected from: 110° to 115°, 115° to 120°, 120° to 125°, 12° to 130°, 130° to 135°, or 135° to 140°.

According to one embodiment of the hydrophobic low-dielectric-constant film, a Young's modulus range of the hydrophobic low-dielectric-constant film is selected from: 6 GPa to 7 GPa, 7 GPa to 8 GPa, 8 GPa to 9 GPa, 9 GPa to 10 GPa, 10 GPa to 11 GPa, 11 GPa to 12 GPa, 12 GPa to 13 GPa, 13 GPa to 14 GPa, or 14 GPa to 15 GPa.

Another aspect of the present disclosure provides a preparation method for a hydrophobic low-dielectric-constant film, comprising:
  (A) introducing one or more fluorine-containing compounds A having a general formula $C_xSi_yO_mH_nF_{2x+2y-n+2}$ or $C_xSi_yO_mH_nF_{2x+2y-n}$ into a reaction chamber of a reaction apparatus;
  (B) introducing a plasma source gas into the reaction chamber; and
  (C) at a predetermined power, by reacting the one or more fluorine-containing compounds on a substrate within the chamber, vapor depositing a hydrophobic low-dielectric-constant film.

According to one embodiment, the preparation method for a hydrophobic low-dielectric-constant film further comprises: introducing a crosslinker agent compound B into the reaction chamber of the reaction apparatus.

According to one embodiment, the preparation method for a hydrophobic low-dielectric-constant film further comprises: introducing a compound C having a large steric hindrance volume into the reaction chamber of the reaction apparatus.

According to one embodiment, the preparation method for a hydrophobic low-dielectric-constant film further comprises: introducing a crosslinker compound B and a compound C having a large steric hindrance volume into the reaction chamber of the reaction apparatus.

According to one embodiment, the preparation method for a hydrophobic low-dielectric-constant film comprises: operating the substrate, such that the substrate is in a moving state within the reaction chamber.

According to one embodiment, the preparation method for a hydrophobic low-dielectric-constant film further comprises: cleaning the substrate.

According to one embodiment, the preparation method for a hydrophobic low-dielectric-constant film prior to step (A) further comprises: vacuuming the reaction chamber.

According to one embodiment of the preparation method for a hydrophobic low-dielectric-constant film, the plasma source gas is selected from: inert gases or fluorocarbons.

According to one embodiment of the preparation method for a hydrophobic low-dielectric-constant film, the plasma source gas is selected from: helium or carbon tetrafluoride.

According to one embodiment of the preparation method for a hydrophobic low-dielectric-constant film, the input power density of the reaction apparatus ranges from 0.0001 W/L to 10 W/L.

According to one embodiment of the preparation method for a hydrophobic low-dielectric-constant film, the chamber temperature of the reaction apparatus ranges from 10° C. to 100° C.

According to one embodiment of the preparation method for a hydrophobic low-dielectric-constant film, the substrate includes one selected from a group consisting of: a printed circuit board (PCB), a circuit board of a mobile phone antenna and a mobile phone flexible printed circuit (FPC).

DETAILED DESCRIPTION

Figure 1:
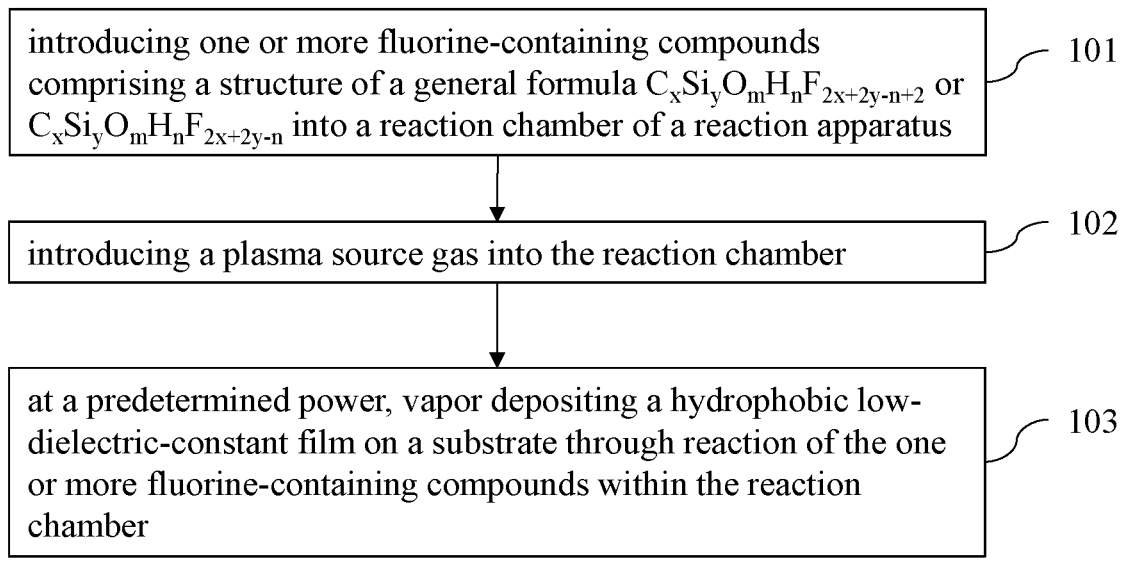
FIG. 1 schematically illustrates a block diagram of a preparation process for a low-dielectric-constant film according to one embodiment of the present disclosure.

The following description serves to disclose the present disclosure to enable those skilled in the art to practice the present disclosure. The preferred embodiments in the following description are by way of example only, those skilled in the art will appreciate other obvious variations. The basic principles of the present disclosure as defined in the following description may be applied to other embodiments, variations, modifications, equivalents, and other technical solutions without departing from the spirit and scope of the present disclosure.

Those skilled in the art will appreciate that, in the disclosure of the present disclosure, the terms "longitudinal", "transverse", "upper", "lower", "front", "rear", "left", "right", "vertical", "horizontal", "top", "bottom", "inner", "outer" and the like indicate azimuth or positional relationships based on the azimuth or positional relationships shown in the drawings. It is only intended to facilitate the description and simplify the description, and not to indicate or imply that the apparatus or element referred to must have a particular orientation, be constructed and operated in a particular orientation, so the above-mentioned terms are not to be construed to limit the present disclosure.

It will be appreciated that the term "a", "an", or "one" is to be understood as "at least one" or "one or more", i.e., in one embodiment, the number of one element may be one and in another embodiment the number of one element may be multiple, and that the term "a", "an", or "one" is not to be construed to limit the number.

Reference to "one embodiment", "an embodiment", "an exemplary embodiment", "various embodiments", "some embodiments", and the like indicates that such embodiments describing the present disclosure may include particular features, structures, or characteristics, but it is not necessary for each embodiment to include the feature, structure, or characteristic. In addition, some embodiments may have some, all, or none of the features described for other embodiments.

The present disclosure provides a hydrophobic low-dielectric-constant film and a preparation method therefor. The hydrophobic low-dielectric-constant film or coating comprises oxygen, carbon and fluorine. For example, the hydrophobic low-dielectric-constant film comprises oxygen, carbon, fluorine, and silicon. For example, the hydrophobic low-dielectric-constant film comprises hydrogen, oxygen, carbon, fluorine, and silicon. The hydrophobic low-dielectric-constant film has a thickness in a nanoscale range of, for example but not limited to, 10-2000 nm.

The hydrophobic low-dielectric-constant film has good dielectric properties. The k value of the hydrophobic low-dielectric-constant film is less than 3.2. For example, the k value of the hydrophobic low-dielectric-constant film ranges from 1.8 to 2.8. For example, a range of the k value of the hydrophobic low-dielectric-constant film is selected from: 1.8 to 1.9, 1.9 to 2.0, 2.0 to 2.1, 2.1 to 2.2, 2.2 to 2.3, 2.3 to 2.4, 2.4 to 2.5, 2.5 to 2.6, 2.6 to 2.7, or 2.7 to 2.8. The dielectric loss of the hydrophobic low-dielectric-constant film is less than 0.0001.

The hydrophobic low-dielectric-constant film has an excellent hydrophobic performance, the static contact angle of water adhered to the hydrophobic low-dielectric-constant film being greater than 100°. For example, the hydrophobic low-dielectric-constant film has a static contact angle in a range of 110° to 140°. For example, the static contact angle of the hydrophobic low-dielectric-constant film is selected from: 110° to 115°, 115° to 120°, 120° to 125°, 125° to 130°, 130° to 135° or 135° to 140°. For example, the static contact angle of the hydrophobic low-dielectric-constant film is 111°, 116°, 123°, 128°, 129°, 132°, 133°, so that the hydrophobic low-dielectric-constant film has good corrosion resistance.

The hydrophobic low-dielectric-constant film has good mechanical properties, for example, the Young's modulus of the hydrophobic low-dielectric-constant film being greater than 6 GPa. For example, the Young's modulus range of the hydrophobic low-dielectric-constant film is selected from: 6-7 GPa, 7-8 GPa, 8-9 GPa, 9-10 GPa, 10-11 GPa, 11-12 GPa, 12-13 GPa, 13-14 GPa, or 14-15 GPa.

According to this embodiment of the present disclosure, the hydrophobic low-dielectric-constant film is formed by plasma enhanced chemical vapor deposition (PECVD) method on a surface of a substrate. i.e., the raw material for forming the hydrophobic low-dielectric-constant film is deposited by PECVD process on the surface of the substrate, forming the hydrophobic low-dielectric-constant film on the surface of the substrate. By way of example, but not limited to, deposit the hydrophobic low-dielectric-constant film on the surface of a large scale integrated circuit board to improve the RC delay phenomenon of the large scale integrated circuit board.

Further, the hydrophobic low-dielectric-constant film is formed by a plasma reaction apparatus by a PECVD method. That is, during deposition, the substrate is placed in a reaction chamber of the plasma reaction apparatus, a reactant is introduced into the reaction chamber, and plasma discharge is performed to generate plasma, the substrate is exposed to a reactant gas atmosphere, thereby the hydrophobic low-dielectric-constant film is deposited and formed on the surface of the substrate.

The substrate is illustrated, but not limited to, a PCB, a circuit board of a mobile phone antenna, or a mobile phone FPC.

The plasma enhanced chemical vapor deposition (PECVD) method generates plasma through glow discharge, and the discharge method comprises microwave discharge, radio frequency discharge, ultraviolet discharge, and electric spark discharge.

Notably, by PECVD method, the drawback could be avoided that the raw materials need to be activated under high specific condition therebetween in conventional chemical reactions. In addition, the PECVD method adopts a wide range of materials. Plasma utilizes electrons and ions to directly bombard the active position of the reactant for reactive activation, and the activation capability is closely related to the energy of the electrons and the ions in the plasma, which could be conveniently regulated and controlled by controlling parameters such as the applied power, the applied power time and the like.

The reactant gas could be chemical substance which could be gas at normal temperature and normal pressure, also could be steam formed from liquid substance whose boiling point is less than 350° C. under normal pressure by means of decompression, heating, etc. The reactant gas is composed of two or more than two kinds of mixtures.

In one embodiment of the present disclosure, the hydrophobic low-dielectric-constant film uses a fluorine-containing compound A and a polyfunctional group compound B as reactants, adopts PECVD process, to form the hydrophobic low-dielectric-constant film. When the hydrophobic low-dielectric-constant film is prepared, the compound A and the compound B could be simultaneously introduced or successively introduced.

According to one embodiment of the present disclosure, a plasma enhanced chemical vapor deposition (PECVD) method is adopted, a material with low polarizability is used as a reactant, to form a nanofilm with a non-porous structure, having low dielectric constant and good hydrophobicity.

Furthermore, the hydrophobic low-dielectric constant film has a fluoropolymer or a fluorosilicone polymer with low surface energy, has good hydrophobic property, has a large static contact angle when water is on the surface thereof, and is suitable for being applied to electronic devices.

Furthermore, the hydrophobic low-dielectric-constant film has asymmetric fluorocarbon material constituting units, and is easy to process and secondarily mold.

Further, the fluorine-containing compound A has a general formula $C_xSi_yO_mH_nF_{2x+2y-n+2}$ or $C_xSi_yO_mH_nF_{2x+2y-n}$, wherein x is an integer from 1 to 20, y is an integer from 0 to 8, m is an integer from 0 to 6, and n is 0, 3, 6, 7, 9, 10, 12, 13, 15, 16, 17, 19. In order to obtain a low-dielectric-constant film having good hydrophobic properties, the oxygen content in the low-dielectric-constant film should be controlled, and in order to reduce the dielectric constant in the low-dielectric-constant film, the fluorine content should be relatively high. Preferably, x is an integer from 1 to 10, y is an integer from 0 to 6, and m is an integer from 0 to 3.

For example, the compound B comprises a bifunctional or polyfunctional group molecule, such as a diene, perfluorodiene, or an epoxy group-comprising olefin.

In one embodiment of the present disclosure, the hydrophobic low-dielectric-constant film uses fluorine-containing compound A and a compound C with large steric hindrance volume as reactants, by a PECVD process, to form the hydrophobic low-dielectric-constant film. When preparing the hydrophobic low-dielectric-constant film, the compound A and the compound C could be introduced simultaneously or sequentially. For example, the compound C could be one or more selected from a group consisting of benzene ring-comprising aromatic hydrocarbon, fluorine-substituted aromatic hydrocarbon, and cyclohexane. For example, the compound C could be one or more selected from a group consisting of cycloalkane, aromatic hydrocarbon, fused ring aromatic hydrocarbon, and aromatic heterocycle.

In one embodiment of the present disclosure, the hydrophobic low-dielectric constant film is prepared by taking the fluorine-containing compound A, the compound B and the compound C as reactants, through a PECVD process, to form the hydrophobic low-dielectric constant film. When preparing the hydrophobic low-dielectric constant film, the compound A, the compound B and the compound C could be introduced simultaneously or sequentially.

Further, the total input ratio of the compound A is greater than 35%, preferably, the total input ratio of the compound A is greater than 40%, wherein the ratio is the molar ratio.

For example, the compound A is one or more selected from a group consisting of: tetrafluoroethylene, hexafluoropropylene, hexafluoroethane, hexafluoropropylene oxide, 1H,1H,2H,2H-perfluorooctyltriethoxysilane, trimethylfluorosilane, and octafluorobutene.

For example, the compound B is one or more selected from a group consisting of: butadiene, perfluorobutadiene, pentadiene, 1,2-epoxy-5-hexene, hexadiene, and heptadiene.

For example, the compound C is one or more selected from a group consisting of: cyclohexane, toluene, xylene, vinylbenzene, divinylbenzene, dicyclopentadiene, naphthalene, and pyridine.

Notably, when the compound B is used as a reactant, the compound is used as a cross-linking agent, to enhance the degree of compactness of the hydrophobic low-dielectric-constant film. In other words, during deposition, the molecules of the compound A and the compound B or the molecules of the reactant A, the compound B and the compound C are bonded more tightly, so that the hydrophobic low-dielectric-constant film has good mechanical properties, such as greater Young's modulus.

The compound B is a multifunctional group crosslinking agent. The functional groups could be selected from a group consisting of carbon-carbon double bonds, carbon-carbon triple bonds, epoxy groups and the like. Because after the carbon-carbon double bonds, the epoxy groups respectively undergo the double bond reaction, the ring-opening reaction, the molecular structure is kept in a saturated state, the carbon-carbon double bonds and/or the epoxy groups are preferably used as the crosslinking functional groups, and the hydrophobicity and symmetry of molecules could be improved.

Notably, when the compound C is used as a reactant, the compound C has a large steric hindrance volume, which increases the free volume of the polymer in the hydrophobic low-dielectric-constant film and is favorable for improving the hydrophobicity of molecules.

Notably, in preparing the hydrophobic low-dielectric-constant film, the addition amounts of the compound A, the compound B and/or the compound C, and the proportion of each reactant and the technological parameters in vapor deposition could be regulated to obtain nanometer film with different performances. In the actual use of electronic products, the requirements for the dielectric materials are often omni-directional and multi-level. For example, in the preparation process of large-scale integrated circuits, the mechanical properties, water resistance, corrosion resistance and chemical resistance of the coating are required. According to embodiments of the present disclosure, this kind of requirement could be met by selecting different reactants for combination.

It should also be noted that, when preparing the hydrophobic low-dielectric-constant film, after deposition of the hydrophobic low dielectric constant nanometer film according to the present disclosure, there is no need of thermal annealing treatment to eliminate stress to raise the compactness and mechanical performance of the film. Embodiments of the present disclosure utilizes the addition of multifunctional group cross-linking agent, to directly crosslink the low dielectric constant coating material in the polymerization deposition process, so that the compactness is improved, and the thermal annealing treatment procedure in the large-scale production process and the cost generated by the thermal annealing treatment procedure are saved. The high-temperature annealing treatment is not needed, the influence on electronic products is avoided, and embodiments of the present disclosure is suitable for being applied to electronic products and large-scale integrated circuits.

Further, according to some embodiment of the present disclosure, when preparing the hydrophobic low-dielectric-constant film, a dynamic mode is adopted in the PECVD process, i.e., moving the substrate within the reaction chamber. In some embodiment, this movement may be a circular movement in the chamber, the advantages including that the substrate could be positioned at different positions relative to the chamber and uniformly accept the action of the plasma, and the effect of non-uniform concentration distribution of the reaction feedstock on the coating quality can be reduced. In some embodiment of the present disclosure, the operation mode of the substrate could comprise a plurality of modes, for example, the substrate could revolve around the central point of the reaction chamber as a reference point or a preset axis, rotate around the central axis or a preset axis of the substrate, or respectively rotate around two transverse and longitudinal axes.

Further, according to some embodiment of the present disclosure, the volume of the vacuum reaction chamber of the selected reaction apparatus is not less than 100 L, the input power density of the plasma generating mode ranges from 0.0001 W/L to 10 W/L. Therefore, the present disclosure could be suitable for large-scale production and application, and reduce the production cost. The electrode for radio frequency discharge of the reaction apparatus consists of a plurality of symmetrical electrode plates, so that the hydrophobic low-dielectric constant film deposited on the surface of the substrate could be more uniform.

Further, according to one embodiment of the present disclosure, when preparing the hydrophobic low-dielectric-constant film, a plasma source gas is provided to facilitate plasma generation. The plasma source gas is, for example, but not limited to, an inert gas, or a fluorocarbon compound. The type of the plasma source gas needs to be based on the reactants added, that is, the compound A, compound B, and compound C, to determine. By way of example, but without limitation, the inert gas selects helium. By way of example, but without limitation, the fluorocarbon compound selects carbon tetrafluoride.

FIG. 1 is a block diagram of a process for preparing a hydrophobic low-dielectric-constant film in accordance with one embodiment of the present disclosure. The hydrophobic low-dielectric-constant film may be formed by vapor deposition by a plasma reaction apparatus.

According to one embodiment of the present disclosure, a preparation method for a hydrophobic low-dielectric-constant film comprises steps of:

101: introducing one or more fluorine-containing compounds comprising a structure of a general formula $C_xSi_yO_mH_nF_{2x+2y-n+2}$ or $C_xSi_yO_mH_nF_{2x+2y-n}$ into a reaction chamber of a reaction apparatus;

102: introducing a plasma source gas into the reaction chamber; and

103: at a predetermined power, vapor depositing a hydrophobic low-dielectric-constant film on a substrate through reaction of the one or more fluorine-containing compounds within the reaction chamber.

In one embodiment, the hydrophobic low-dielectric-constant film is formed by vapor deposition of a fluorine-containing compound A and a crosslinker compound B.

The step 101 may include a step of: introducing a fluorine-containing compound A and a crosslinker compound B into the reaction chamber of the reaction apparatus. The fluorine-containing compound A includes one or more selected from a group consisting of: tetrafluoroethylene, hexafluoropropylene, hexafluoroethane, hexafluoropropylene oxide, 1H,1H,2H,2H-perfluorooctyltriethoxysilane, trimethylfluorosilane, and octafluorobutene. The crosslinker compound B includes one or more selected from a group consisting of: butadiene, perfluorobutadiene, pentadiene, 1,2-epoxy-5-hexene, hexadiene and heptadiene.

In one embodiment, the hydrophobic low-dielectric-constant film is formed by vapor deposition of a fluorine-containing compound A and a compound C having a large steric hindrance volume.

The step 101 may include a step of: introducing a fluorine-containing compound A and a compound C having a large steric hindrance volume into the reaction chamber of the reaction apparatus. The fluorine-containing compound A includes one or more selected from a group consisting of: tetrafluoroethylene, hexafluoropropylene, hexafluoroethane, hexafluoropropylene oxide, 1H,1H,2H,2H-perfluorooctyl-triethoxysilane, trimethylfluorosilane and octafluorobutene. The compound C includes one or more selected from a group consisting of: cyclohexane, toluene, xylene, vinylbenzene, divinylbenzene, dicyclopentadiene, naphthalene and pyridine.

In one embodiment, the hydrophobic low-dielectric-constant film is formed by vapor deposition of a fluorine-containing compound A, a crosslinker compound B, and a compound C having a large steric hindrance volume.

The step 101 may include a step of: introducing a fluorine-containing compound A, a crosslinker compound B, and a compound C having a large steric hindrance volume into the reaction chamber of the reaction apparatus. The fluorine-containing compound A includes one or more selected from a group consisting of: tetrafluoroethylene, hexafluoropropylene, hexafluoroethane, hexafluoropropylene oxide, 1H,1H,2H,2H-perfluorooctyltriethoxysilane, trimethylfluorosilane, and octafluorobutene. The crosslinker compound B includes one or more selected from a group consisting of: butadiene, perfluorobutadiene, pentadiene, 1,2-epoxy-5-hexene, hexadiene and heptadiene. The compound C having a large steric hindrance volume includes one or more selected from a group consisting of: cyclohexane, toluene, xylene, vinylbenzene, divinylbenzene, dicyclopentadiene, naphthalene and pyridine.

The plasma source gas introduced in the step 102 is by way of example, but not limited to, an inert gas, and a fluorocarbon compound, such as helium, and carbon tetrafluoride.

The preparation method for the hydrophobic low-dielectric-constant film may further comprise a step of: 104: operating the substrate, i.e., making the substrate to be in a moving state in the reaction chamber. The movement may be a circular movement within the chamber. In some embodiment of the present disclosure, the operation mode of the substrate could comprise a plurality of modes, for example, the substrate could revolve around the central point of the reaction chamber as a reference point or a preset axis, rotate around the central axis or a preset axis of the substrate, or respectively rotate around two transverse and longitudinal axes.

The step 104 may precede the step 103.

Prior to the step 101, the substrate may also be pretreated, for example, before chemical vapor deposition of the substrate, the substrate may be cleaned. Dust, moisture, grease and the like on the substrate surface adversely affect the deposition effect. For example, the substrate may be cleaned with acetone or isopropanol, and then dried in a drying box.

In one embodiment, a preparation method for a hydrophobic low-dielectric-constant film may comprise: (1) preparing a substrate, before chemical vapor deposition of the substrate, cleaning the substrate first. Dust, moisture, grease and the like on the substrate surface adversely affect the deposition effect. The substrate is firstly cleaned with acetone or isopropanol, and then dried in a drying box. (2) preparing the nanometer film by chemical vapor deposition of the substrate. (a) placing the substrate with a clean surface in a reaction chamber of plasma equipment, then continuously vacuumizing the reaction chamber to 1-2,000 mTorr; (b) opening the moving mechanism to make the substrate to be in moving state in the chamber; introducing a plasma source gas, adopting radio frequency discharge or ultraviolet irradiation in the chamber to make the plasma produced in the chamber. The reactant gas and the plasma source may be introduced at the same time, or after the plasma source is introduced. In some embodiment, firstly, pretreat the substrate for 1-1200 s, then introduce the reactant gas according to technological parameter requirement; (c) setting the pressure and temperature of the vacuum reaction chamber, introducing different reactant gases, regulating the plasma generating power to 1-500 W, regulating the chamber temperature to 10-100° C., and conducting plasma chemical vapor depositing. After the reaction is completed, stopping introducing the reactant gases and raising the chamber pressure to normal pressure.

Typically, the volume of the selected vacuum reaction chamber is not less than 100 L, and the input power density of the plasma generating mode is in a range of 0.0001 W/L to 10 W/L.

Specific examples are illustrated below.

Example 1

The present disclosure relates to a low dielectric constant nano-film or nano coating applied to a printed circuit board (PCB) and a preparation method therefor. The preparation method comprises steps of:
  (1) washing the PCB substrate with acetone or isopropanol, drying with a dust-free cloth, and drying in a drying box for 24 h.
  (2) placing the dried PCB of the electronic device in a 300 L plasma vacuum reaction chamber, continuously vacuumizing the reaction chamber to make the vacuum degree reach 10 mTorr.
  (3) introducing helium gas with a flow rate of 20 sccm, starting pulse plasma discharge to pretreat the PCB, at a discharging frequency of 500 Hz, a discharging power of 10 W, and a discharging time of 100 s.
  (4) introducing tetrafluoroethylene, butadiene, and toluene at the same time, carrying out chemical vapor deposition on the surface of the substrate to prepare the nano coating, wherein the introducing speeds of the three reaction monomers were respectively 150 μL/min, 20 μL/min and 5 μL/min, and the introducing time was respectively 2000 s.
  (5) after the coating was prepared, introducing compressed air to restore the reaction chamber to normal pressure, opening the chamber, and taking out the PCB of the electronic device. A layer of nano coating with low dielectric constant was coated on the PCB.

Example 2

The present disclosure relates to a low dielectric constant nano coating applied to mobile phone antenna protection and a preparation method therefor. The preparation method comprises following steps:
  (1) washing the circuit board with mobile phone antenna with acetone or isopropanol, drying with a dust-free cloth, and drying in a drying box for 24 h.
  (2) placing the dried mobile phone antenna circuit board in a 1000 L plasma vacuum reaction chamber, continuously vacuumizing the reaction chamber to make the vacuum degree reach 50 mTorr.
  (3) introducing helium gas with a flow rate of 40 sccm, starting microwave plasma discharge to pretreat the mobile phone antenna circuit board, in the pretreatment stage the discharge frequency being 433 MHz, the discharge power being 100 W, and the discharge time being 100 s.
  (4) introducing hexafluoroethane, butadiene, and vinylbenzene at the same time, carrying out chemical vapor deposition on the surface of the substrate to prepare the nano coating, wherein the introducing speeds of the three reaction monomers were 250 μL/min, 10 μL/min, and 5 μL/min respectively, and the introducing time was respectively 3000 s.
  (5) after the coating was prepared, introducing compressed air to restore the reaction chamber to normal pressure, opening the chamber, and taking out the mobile phone antenna circuit board. A layer of nanometer coating with low dielectric constant was coated on the mobile phone antenna circuit board.

Example 3

The present disclosure relates to a low dielectric constant nano coating applied to mobile phone antenna protection and a preparation method therefor. The preparation method comprises following steps:

(1) washing the circuit board with mobile phone antenna with acetone or isopropanol, drying with a dust-free cloth, and drying in a drying box for 24 h.

(2) placing the dried mobile phone antenna circuit board in a 2000 L plasma vacuum reaction chamber, continuously vacuumizing the reaction chamber to make the vacuum degree reach 80 mTorr.

(3) introducing helium gas with a flow rate of 40 sccm, starting microwave plasma discharge to pretreat the mobile phone antenna circuit board, at a discharging frequency of 2450 MHz, a discharging power of 400 W and a discharging time of 200 s.

(4) introducing hexafluoropropylene oxide, pentadiene, and cyclohexane at the same time, carrying out chemical vapor deposition on the surface of the substrate to prepare the nano coating, wherein the introduction speeds of the three reaction monomers were respectively 350 μL/min, 30 μL/min and 5 μL/min, and the introduction time was respectively 3000 s.

(5) after the coating was prepared, introducing compressed air to restore the reaction chamber to normal pressure, opening the chamber, and taking out the mobile phone antenna circuit board. A layer of nanometer coating with low dielectric constant was coated on the mobile phone antenna circuit board.

Example 4

The present disclosure relates to a low dielectric constant nano coating applied to mobile phone FPC protection and a preparation method therefor. The preparation method comprises following steps:

(1) washing a mobile phone FPC with acetone or isopropanol, drying with a dust-free cloth, and drying in a drying box for 24 h.

(2) placing the dried mobile phone FPC in a 2000 L plasma vacuum reaction chamber, continuously vacuumizing the reaction chamber to make the vacuum degree reach 80 mTorr.

(3) introducing helium gas with a flow rate of 40 sccm, starting microwave plasma discharge to pretreat the mobile phone FPC, with a discharge frequency of 2450 MHz, a discharge power of 400 W and a discharge time of 200 s.

(4) introducing hexafluoroepoxypropane, 1,2-epoxy-5-hexene, and dicyclopentadiene at the same time, carrying out chemical vapor deposition on the surface of the substrate to prepare the nano coating, wherein the introducing speeds of the three reaction monomers were respectively 400 μL/min, 20 μL/min, and 10 μL/min, and the introducing time was respectively 3000 s.

(5) after finishing the coating preparation, introducing compressed air to restore the reaction chamber to normal pressure, opening the chamber, taking out the mobile phone FPC. A layer of nanometer coating with low dielectric constant was coated on the mobile phone FPC.

Example 5

Compared to example 1, the monomer tetrafluoroethylene in the step (4) was replaced with 1H,1H,2H,2H-perfluorooctyltriethoxysilane, without changing other conditions.

Example 6

Compared with example 1, the monomer toluene flow rate in the step (4) was changed to zero, i.e. no introduction, and other conditions were not changed.

Example 7

Compared with example 1, helium in the step (3) was changed to carbon tetrafluoride without changing other conditions.

Example 8

Compared to example 1, the tetrafluoroethylene in the step (4) was changed to a mixture of tetrafluoroethylene and trimethylfluorosilane in a molar ratio of 2:1, with other conditions unchanged.

Example 9

Compared to example 1, the tetrafluoroethylene in the step (4) was changed to a mixture of tetrafluoroethylene and trimethylfluorosilane in a molar ratio of 1:1, with other conditions unchanged.

Example 10

Compared to example 1, the butadiene flow in the step (4) was changed to 0, with other conditions unchanged.

Notably, in the examples described above, the forming process of the hydrophobic low-dielectric-constant film was illustrated with respectively a PCB, a circuit board of mobile phone antenna and a mobile phone FPC as a substrate. However, in other embodiments of the present disclosure, plasma enhanced chemical vapor deposition may be performed using other electronic devices as substrates to form the hydrophobic low-dielectric-constant film, and the present disclosure is not limited in this respect.

Further, parameters of the above-described examples were detected.

The nano coating thickness was measured using a Filmetrics F20-UV-film thickness measurer.

The water contact angle of the nano coating was tested according to the GB/T 30447-2013 standard.

The dielectric constant was measured by a recommended method for measuring permittivity and dielectric loss factor of an electrical insulating material at power frequency, audio frequency and high frequency (including meter wave wavelength) according to GB/T 1409-2006.

The Young's modulus of the nano coating was determined according to the technical specification of the JB/T 12721-2016 solid material in-situ nano indentation/scratch tester.

Table: Performance Parameters of Examples 1-10

TABLE I

| Examples | Thickness/nm | Contact angle/° | Dielectric constant | Dielectric loss | Young's modulus/GPa |
|---|---|---|---|---|---|
| Example 1 | 186 | 129 | 1.92 | <0.0001 | 8.78 |
| Example 2 | 315 | 132 | 2.21 | <0.0001 | 9.63 |
| Example 3 | 340 | 116 | 2.03 | <0.0001 | 11.22 |
| Example 4 | 296 | 111 | 1.86 | <0.0001 | 6.95 |
| Example 5 | 192 | 116 | 2.33 | <0.0001 | 8.96 |
| Example 6 | 210 | 132 | 2.42 | <0.0001 | 13.5 |

TABLE I-continued

| Examples | Thickness/nm | Contact angle/° | Dielectric constant | Dielectric loss | Young's modulus/GPa |
|---|---|---|---|---|---|
| Example 7 | 152 | 128 | 2.37 | <0.0001 | 8.36 |
| Example 8 | 136 | 123 | 2.52 | <0.0001 | 12.36 |
| Example 9 | 123 | 133 | 2.65 | <0.0001 | 8.30 |
| Example 10 | 174 | 128 | 2.01 | <0.0001 | 3.12 |

By adopting the technology of the present disclosure, a waterproof nanofilm which could be applied to a large-scale integrated circuit could be obtained. Utilizing plasma chemical vapor deposition method, a hydrophobic nano-film with a relative dielectric constant of about 2.0 was obtained; by adding a cross-linking agent, the compactness of the nanofilm is improved, and the mechanical property of the nanofilm is specifically improved.

Finally, it should be noted that: the above examples are merely illustrative of the technical solution of the present disclosure and are not intended to be limiting; while the present disclosure has been described in detail with reference to the foregoing embodiments, it will be appreciated by those skilled in the art that modifications may be made to the embodiments described above, or equivalents may be substituted for some or all of the features thereof; these modifications or substitutions do not make the spirit of the corresponding technical solution depart from the scope of the technical solutions of various embodiments of the present disclosure.

Those skilled in the art will appreciate that, the embodiments of the present disclosure shown in the foregoing description and the accompanying drawings are by way of example only and are not intended to limit the present disclosure. The object of the present disclosure has been completely and effectively realized. The functionality and structural principles of the present disclosure have been shown and illustrated in the embodiments, and embodiments of the present disclosure may be varied or modified without departing from the principles described herein.

What is claimed is:

1. A hydrophobic low-dielectric-constant film, formed of a fluorine-containing compound A and a compound B by plasma enhanced chemical vapor deposition, wherein the fluorine-containing compound A comprises one or more compounds having a general formula $C_xSi_yO_mH_nF_{2x+2y-n+2}$ or $C_xSi_yO_mH_nF_{2x+2y-n}$, wherein x is an integer from 1 to 20, y is an integer from 0 to 8, m is an integer from 0 to 6, and n is 0, 3, 6, 7, 9, 10, 12, 13, 15, 16, 17, 19, wherein the compound B comprises one or more selected from a group consisting of: butadiene, pentadiene, 1,2-epoxy-5-hexene, and heptadiene.

2. The hydrophobic low-dielectric-constant film according to claim 1, wherein the hydrophobic low-dielectric-constant film is formed of the compound A, the compound B and a compound C by plasma enhanced chemical vapor deposition.

3. The hydrophobic low-dielectric-constant film according to claim 2, wherein a molar ratio of the compound A is greater than 35%.

4. The hydrophobic low-dielectric-constant film according to claim 2, wherein the compound C comprises one or more selected from a group consisting of: cyclohexane, toluene, xylene, vinylbenzene, divinylbenzene, dicyclopentadiene, naphthalene, and pyridine.

5. The hydrophobic low-dielectric-constant film according to claim 2, wherein the compound C is selected from: cycloalkanes, aromatics, fused ring aromatics, and aromatic heterocycles.

6. The hydrophobic low-dielectric-constant film according to claim 1, wherein x is an integer from 1 to 10, y is an integer from 0 to 6, and m is an integer from 0 to 3.

7. The hydrophobic low-dielectric-constant film according to claim 1, wherein the compound A comprises one or more selected from a group consisting of: tetrafluoroethylene, hexafluoropropylene, hexafluoroethane, hexafluoropropylene oxide, 1H, 1H,2H,2H-perfluorooctyltriethoxysilane, trimethylfluorosilane, and octafluorobutene.

8. The hydrophobic low-dielectric-constant film according to claim 1, wherein a k value range of the hydrophobic low-dielectric-constant film is selected from: 1.8 to 1.9, 1.9 to 2.0, 2.0 to 2.1, 2.1 to 2.2, 2.2 to 2.3, 2.3 to 2.4, 2.4 to 2.5, 2.5 to 2.6, 2.6 to 2.7, or 2.7 to 2.8.

9. The hydrophobic low-dielectric-constant film according to claim 1, wherein the hydrophobic low-dielectric-constant film has a static contact angle selected from: 110° to 115°, 115° to 120°, 120° to 125°, 125° to 130°, 130° to 135°, or 135° to 140°.

10. The hydrophobic low-dielectric-constant film according to claim 1, wherein a Young's modulus range of the hydrophobic low-dielectric-constant film is selected from: 6 GPa to 7 GPa, 7 GPa to 8 GPa, 8 GPa to 9 GPa, 9 GPa to 10 GPa, 10 GPa to 11 GPa, 11 GPa to 12 GPa, 12 GPa to 13 GPa, 13 GPa to 14 GPa, or 14 GPa to 15 GPa.

11. A preparation method for the hydrophobic low-dielectric-constant film according to claim 1, comprising steps of:
(A) introducing the fluorine-containing compound A and the compound B into a reaction chamber of a reaction apparatus;
(B) introducing a plasma source gas into the reaction chamber; and
(C) depositing the hydrophobic low-dielectric-constant film on a substrate by plasma enhanced chemical vapor deposition within the reaction chamber.

12. The preparation method for the hydrophobic low-dielectric-constant film according to claim 11, further comprising: introducing a compound C into the reaction chamber of the reaction apparatus.

13. The preparation method for the hydrophobic low-dielectric-constant film according to claim 12, wherein a molar ratio of the compound A is greater than 35%.

14. The preparation method for the hydrophobic low-dielectric-constant film according to claim 12, wherein the compound C comprises one or more selected from a group consisting of cyclohexane, toluene, xylene, vinylbenzene, divinylbenzene, dicyclopentadiene, naphthalene, and pyridine.

15. The preparation method for the hydrophobic low-dielectric-constant film according to claim 12, wherein the compound C is selected from: cycloalkanes, aromatics, fused ring aromatics, and aromatic heterocycles.

16. The preparation method for the hydrophobic low-dielectric-constant film according to claim 11, comprising: operating the substrate, such that the substrate is in a moving state within the reaction chamber.

17. The preparation method for the hydrophobic low-dielectric-constant film according to claim 11, further comprising: cleaning the substrate.

18. The preparation method for the hydrophobic low-dielectric-constant film according to claim 11, prior to step (A) further comprising: vacuumizing the reaction chamber.

19. The preparation method for the hydrophobic low-dielectric-constant film according to claim 11, wherein x is an integer from 1 to 10, y is an integer from 0 to 6, and m is an integer from 0 to 3.

20. The preparation method for the hydrophobic low-dielectric-constant film according to claim 11, wherein the compound A comprises one or more selected from a group consisting of: tetrafluoroethylene, hexafluoropropylene, hexafluoroethane, hexafluoropropylene oxide, 1H,1H,2H,2H-perfluorooctyltriethoxysilane, trimethylfluorosilane, and octafluorobutene.

21. The preparation method for the hydrophobic low-dielectric-constant film according to claim 11, wherein a k value range of the hydrophobic low-dielectric-constant film is selected from: 1.8-1.9, 1.9-2.0, 2.0-2.1, 2.1-2.2, 2.2-2.3, 2.3-2.4, 2.4-2.5, 2.5-2.6, 2.6-2.7, or 2.7-2.8.

22. The preparation method for the hydrophobic low-dielectric-constant film according to claim 11, wherein the hydrophobic low-dielectric-constant film has a static contact angle selected from: 110° to 115°, 115° to 120°, 120° to 125°, 125° to 130°, 130° to 135°, or 135° to 140°.

23. The preparation method for the hydrophobic low-dielectric-constant film according to claim 11, wherein a Young's modulus range of the hydrophobic low-dielectric-constant film is selected from: 6 GPa to 7 GPa, 7 GPa to 8 GPa, 8 GPa to 9 GPa, 9 GPa to 10 GPa, 10 GPa to 11 GPa, 11 GPa to 12 GPa, 12 GPa to 13 GPa, 13 GPa to 14 GPa, or 14 GPa to 15 GPa.

24. The preparation method for the hydrophobic low-dielectric-constant film according to claim 11, wherein the plasma source gas is selected from: inert gases or fluorocarbons.

25. The preparation method for the hydrophobic low-dielectric-constant film according to claim 11, wherein the plasma source gas is selected from: helium or carbon tetrafluoride.

26. The preparation method for the hydrophobic low-dielectric-constant film according to claim 11, wherein an input power density of the reaction apparatus is in a range of 0.0001 W/L to 10 W/L.

27. The preparation method for the hydrophobic low-dielectric-constant film according to claim 11, wherein a chamber temperature of the reaction apparatus is in a range of 10-100° C.

28. The preparation method for the hydrophobic low-dielectric-constant film according to claim 11, wherein the substrate comprises one selected from: a printed circuit board (PCB), a circuit board of a mobile phone antenna, and a mobile phone flexible printed circuit (FPC).

* * * * *